United States Patent
Sekiya

(10) Patent No.: US 8,541,287 B2
(45) Date of Patent: Sep. 24, 2013

(54) LASER PROCESSING METHOD FOR WAFER

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/534,220

(22) Filed: Jun. 27, 2012

(65) Prior Publication Data

US 2013/0164914 A1 Jun. 27, 2013

(30) Foreign Application Priority Data

Dec. 26, 2011 (JP) .................. 2011-283060

(51) Int. Cl.
*H01L 21/301* (2006.01)
*H01L 21/46* (2006.01)
*H01L 21/78* (2006.01)
*H01L 21/30* (2006.01)
*B23K 26/00* (2006.01)

(52) U.S. Cl.
USPC .................. 438/462; 438/458; 257/E21.599; 219/121.72

(58) Field of Classification Search
USPC ..... 438/458, 462; 257/E21.211; 219/121.72
See application file for complete search history.

(56) References Cited

U.S. PATENT DOCUMENTS

| | | | |
|---|---|---|---|
| 2010/0267219 A1* | 10/2010 | Kajiyama | 438/462 |
| 2011/0226747 A1* | 9/2011 | Furuta | 219/121.72 |
| 2012/0088354 A1* | 4/2012 | Furuta | 438/463 |
| 2012/0100694 A1* | 4/2012 | Kajiyama et al. | 438/462 |
| 2012/0156858 A1* | 6/2012 | Sekiya | 438/458 |
| 2012/0184084 A1* | 7/2012 | Morikazu et al. | 438/458 |

FOREIGN PATENT DOCUMENTS

| | | |
|---|---|---|
| JP | 10-305420 | 11/1998 |
| JP | 2002-192370 | 7/2002 |

* cited by examiner

*Primary Examiner* — David S Blum
(74) *Attorney, Agent, or Firm* — Greer Burns & Crain, Ltd.

(57) ABSTRACT

A wafer has a device area where a plurality of devices are formed, and a peripheral marginal area surrounding the device area. These devices are formed on the front side of the wafer so as to be partitioned by a plurality of division lines. A modified layer is formed by applying a laser beam along the division lines with the focal point of the laser beam set inside the wafer, thereby forming a modified layer as a division start point inside the wafer along each division line. The wafer is transported to a position where the next step is to be performed. In the modified layer forming step, the modified layer is not formed in the peripheral marginal area of the wafer to thereby form a reinforcing portion in the peripheral marginal area. Accordingly, breakage of the wafer from the modified layer in the transporting step can be prevented.

4 Claims, 8 Drawing Sheets

LASER PROCESSING METHOD FOR WAFER

BACKGROUND OF THE INVENTION

1. Field of the Invention

The present invention relates to a laser processing method for a wafer including the step of applying a laser beam having a transmission wavelength to the wafer toward the back side of the wafer along division lines in the condition where the focal point of the laser beam is set inside the wafer, thereby forming a modified layer inside the wafer along each division line, wherein the modified layer is not formed in a peripheral marginal area where no devices are formed.

2. Description of the Related Art

There is a wafer having a plurality of devices formed on the front side so as to be partitioned by a plurality of division lines. The wafer is cut along the division lines to obtain the individual devices. For example, an optical device wafer is provided by forming an epitaxial layer of gallium nitride (GaN) or the like on the front side of a sapphire substrate, SiC substrate, or the like, wherein the epitaxial layer includes a plurality of optical devices such as LEDs partitioned by a plurality of division lines. The optical device wafer is divided into the individual optical devices by applying a laser beam along the division lines. The optical devices thus obtained are used in various equipment such as a liquid crystal television and a personal computer.

As a method of dividing such a wafer, there is a method using a laser beam having an absorption wavelength (e.g., 266 nm) to a sapphire substrate to thereby form a division groove along each division line on the front side of the sapphire substrate by ablation and next applying an external force to each division groove to thereby divide the wafer into the individual optical devices (see Japanese Patent Laid-open No. Hei 10-305420, for example). In this method, however, a fused material due to the ablation is deposited to the periphery of each optical device, causing a reduction in luminance of each optical device.

To solve this problem, there has been put to practical use a method including the steps of applying a laser beam having a transmission wavelength (e.g., 1064 nm) to a sapphire substrate along the division lines toward the back side where the epitaxial layer is not formed in the condition where the focal point of the laser beam is set inside the wafer, thereby forming a modified layer inside the wafer along each division line, and next applying an external force to the wafer to thereby divide the wafer along each division line. According to this method, the generation of a fused material can be suppressed (see Japanese Patent No. 3408805, for example).

SUMMARY OF THE INVENTION

However, in the case that the modified layer is formed inside the wafer along each division line, there is a possibility that the wafer may be broken from the modified layer in the subsequent transporting step. Further, in the case that a reflection film of gold, aluminum, etc. is formed on the back side of an optical device wafer, the laser beam cannot be applied toward the back side of the wafer.

It is therefore an object of the present invention to provide a laser processing method for a wafer which can eliminate the possibility that the wafer may be broken from the modified layer in transporting the wafer. It is another object of the present invention to provide a laser processing method for a wafer which can form the modified layer inside the wafer by applying a laser beam even in the case of forming a reflection film on the back side of the wafer.

In accordance with an aspect of the present invention, there is provided a processing method for a wafer having a device area where a plurality of devices are formed and a peripheral marginal area surrounding the device area, the plurality of devices being respectively formed in a plurality of regions partitioned by a plurality of division lines formed on the front side of the wafer, the processing method including a modified layer forming step of holding the wafer on a chuck table in the condition where the back side of the wafer is exposed and applying a laser beam having a transmission wavelength to the wafer toward the back side of the wafer along the division lines in the condition where the focal point of the laser beam is set inside the wafer, thereby forming a modified layer as a division start point inside the wafer along each division line; and a transporting step of unloading the wafer from the chuck table and transporting the wafer to a position where a step to be next performed; wherein the modified layer is not formed in the peripheral marginal area of the wafer in the modified layer forming step to thereby form a reinforcing portion in the peripheral marginal area.

In the case that the wafer is an optical device wafer composed of a sapphire substrate and an epitaxial layer formed on the front side of the sapphire substrate, the epitaxial layer including a plurality of optical devices respectively formed in a plurality of regions partitioned by a plurality of division lines, the wafer is transported by the transporting step to a position for performing a back processing step of forming a reflection film on the back side of the wafer.

Preferably, the processing method further includes a dividing step of applying an external force to the division lines of the wafer to thereby divide the wafer into the individual devices after performing the modified layer forming step.

According to the present invention, the reinforcing portion having no modified layers is formed in the peripheral marginal area of the wafer in the modified layer forming step. Accordingly, there is no possibility that the wafer may be broken from the modified layers as a break start point in the subsequent transporting step. Further, even in the case that a reflection film is formed on the back side of the wafer, the reflection film has not yet been formed at the time of performing the modified layer forming step. Accordingly, regardless of whether or not the wafer is a wafer to be processed to form a reflection film on the back side of the wafer, the modified layer can be formed inside the wafer along each division line. Moreover, the wafer can be transported to the position for performing the back processing step in the condition where breakage of the wafer from the modified layers is prevented. Accordingly, the reflection film can be formed on the back side of the wafer in the back processing step, thus supporting the manufacture of an optical device wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
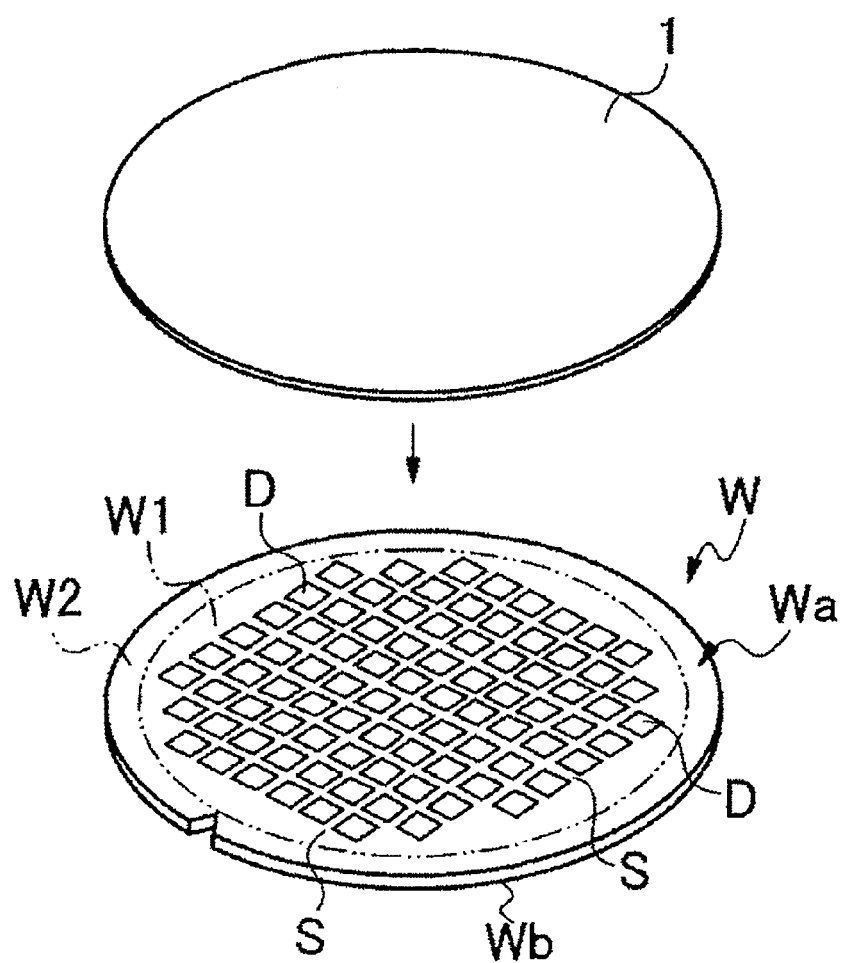
FIG. 1 is a perspective view showing a manner of attaching a protective member to the front side of a wafer.

Referring to FIG. 1, the wafer W is an optical device wafer configured by forming a light emitting layer (epitaxial layer) on the front side of a sapphire substrate. A plurality of crossing division lines S are formed on a front side Wa of the wafer W to thereby partition a plurality of rectangular regions where a plurality of optical devices D are respectively formed. The optical devices D are formed in a device area W1 and are not formed in a peripheral marginal area W2. The device area W1 is surrounded by the peripheral marginal area W2.

(1) Modified Layer Forming Step

Figure 2:
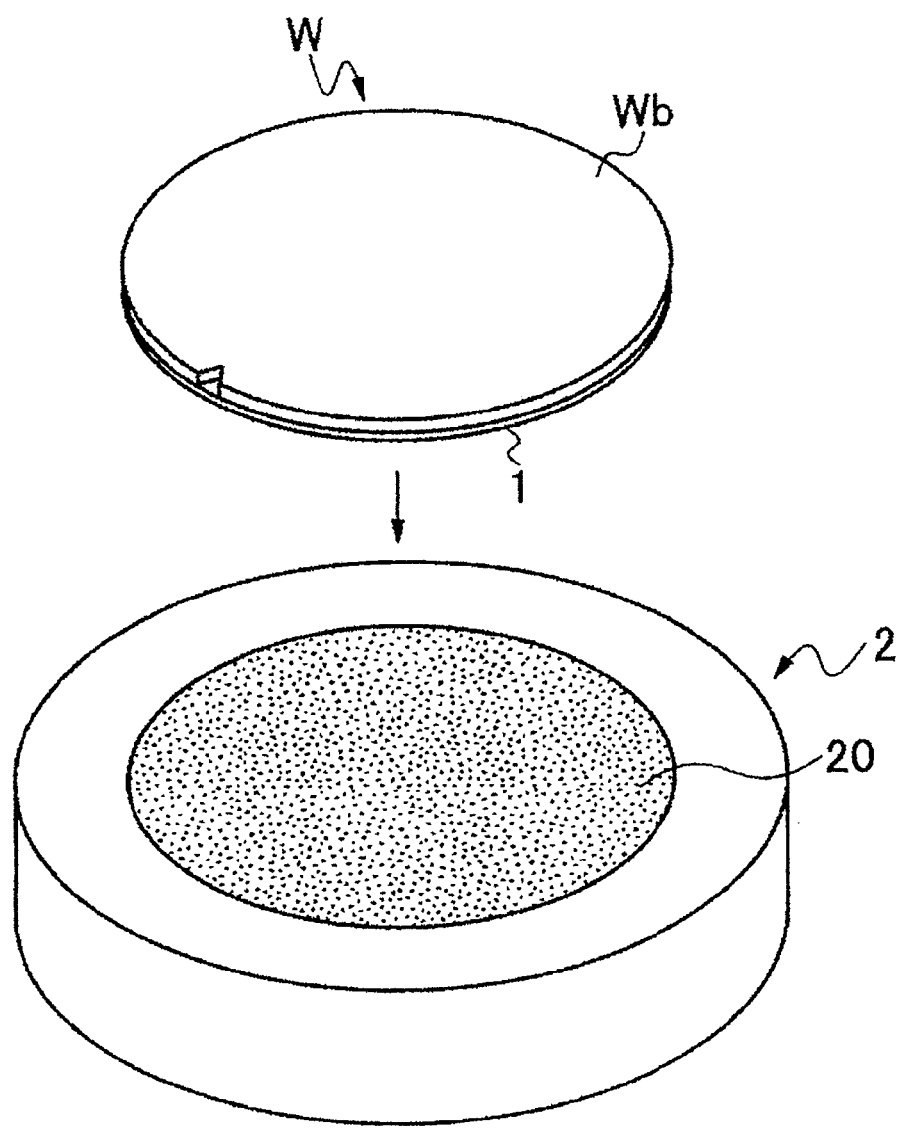
FIG. 2 is a perspective view showing a manner of holding the wafer on a chuck table so that the protective member attached to the front side of the wafer comes into contact with the upper surface of the chuck table.

As shown in FIG. 1, a protective member 1 such as a protective tape is attached to the front side Wa of the wafer W. As shown in FIG. 2, the wafer W with the protective member 1 attached to the front side Wa is turned upside down and placed on a chuck table 2 of a laser processing apparatus in the condition where the protective member 1 attached to the front side Wa comes into contact with the upper surface of the chuck table 2. Then, the wafer W is held under suction on the upper surface of the chuck table 2 in its sucking portion 20 in the condition where the back side Wb of the wafer W is oriented upward, or exposed. At this time, a reflection film has not yet been formed on the back side Wb.

In this step, the division lines S to which a laser beam is to be applied are detected. This detection may be made by providing an ordinary camera on the chuck table 2 side opposed to the front side Wa of the wafer W and imaging the front side Wa. Alternatively, this detection may be made by providing an infrared camera above the back side Wb of the wafer W and imaging the front side Wa from the back side Wb through the wafer W by using infrared light.

Figure 3:
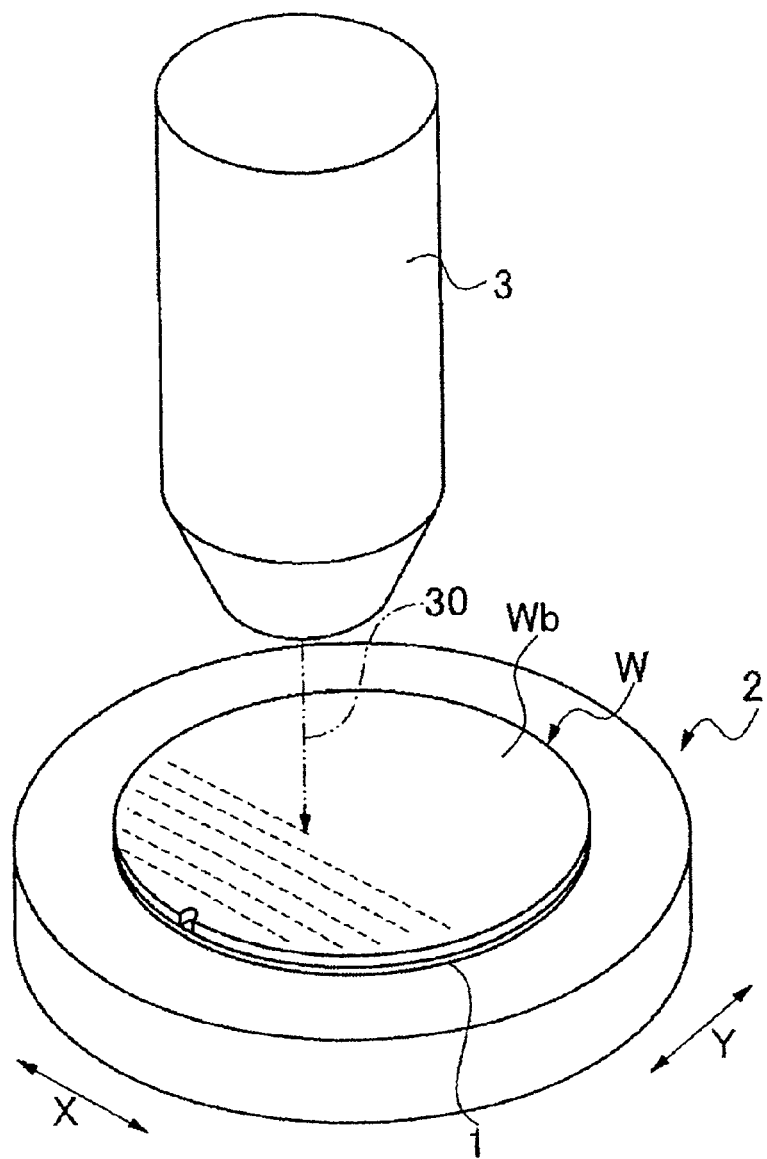
FIG. 3 is a perspective view showing a manner of forming a plurality of modified layers inside the wafer.
Figure 4:
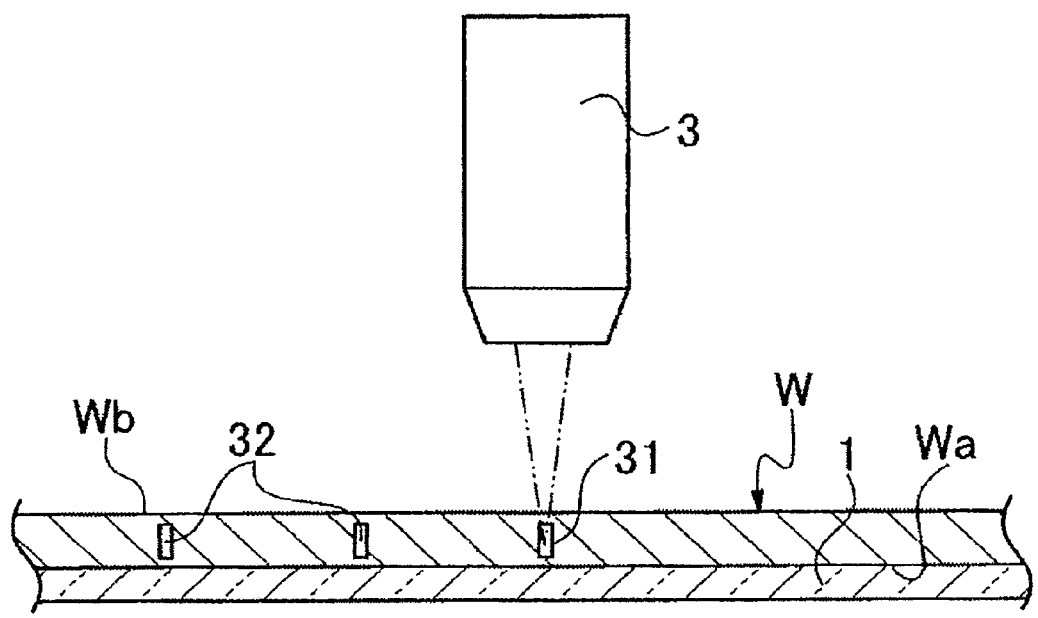
FIG. 4 is a sectional view showing the manner of forming a plurality of modified layers inside the wafer.

As shown in FIG. 3, a laser beam 30 is applied from a laser applying head 3 toward the back side Wb of the wafer W held on the chuck table 2 as moving the chuck table 2 in the X direction. The laser beam 30 has a transmission wavelength to the wafer W. As shown in FIG. 4, the laser beam 30 is applied toward the back side Wb of the wafer W along the division lines S formed on the front side Wa in the condition where the focal point 31 of the laser beam 30 is set inside the wafer W. For example, this laser processing is performed under the following conditions.

Figure 5:
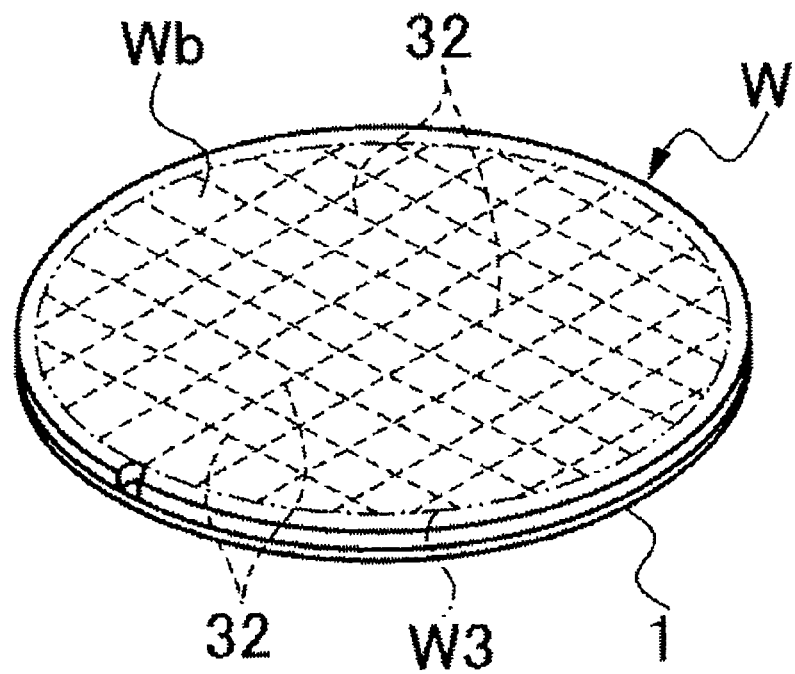
FIG. 5 is a perspective view of the wafer inside of which the modified layers are formed.

Light source: YAG pulsed laser
Wavelength: 1064 nm
Average power: 0.1 to 0.4 W
Repetition frequency: 100 kHz
Feed speed: 300 to 800 mm/second
Thickness of the sapphire substrate: 120 μm
Position of the focal point: 60 μm from the back side
Width of the modified layer: 30 μm This laser processing is performed along a predetermined one of the division lines S extending in a first direction to thereby form a modified layer 32. Thereafter, the laser applying head 3 is indexed in the Y direction by the pitch of the division lines to similarly perform the laser processing along the other division lines S extending in the first direction, thereby forming a plurality of modified layers 32 inside the wafer W along all of the division lines S extending in the first direction. Thereafter, the chuck table 2 is rotated 90° to similarly perform the laser processing along all of the division lines S extending in a second direction perpendicular to the first direction, thereby forming a plurality of modified layers 32 inside the wafer W along all of the division lines S extending in the second direction. As a result, the crossing modified layers 32 are formed inside the wafer W along all of the crossing division lines S extending in the first and second directions as shown in FIG. 5. Each modified layer 32 functions as a division start point in dividing the wafer W.

Figure 6:
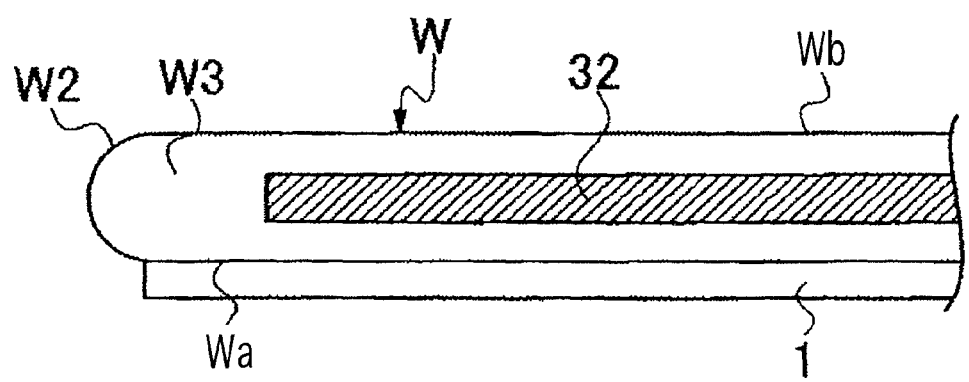
FIG. 6 is a sectional view showing a peripheral reinforcing portion and one of the modified layers formed in the wafer shown in FIG. 5.

In forming the modified layers 32, the laser beam 30 is applied to only the device area W1 of the wafer W, and the laser beam 30 is not applied to the peripheral marginal area W2 of the wafer W. Accordingly, as shown in FIGS. 5 and 6, an annular reinforcing portion W3 having no modified layers is formed in the peripheral marginal area W2. That is, if the modified layers 32 are formed also in the peripheral marginal area W2, the wafer W is easily broken. However, such easy breakage of the wafer W can be prevented by the reinforcing portion W3. This modified layer forming step is performed before forming a metal film (reflection film) on the back side Wb of the wafer W. Accordingly, there is no obstacle on the wafer W in applying the laser beam to the wafer W toward the back side Wb, so that the laser beam can be reliably focused inside the wafer W.

(2) Transporting Step

Figure 7:
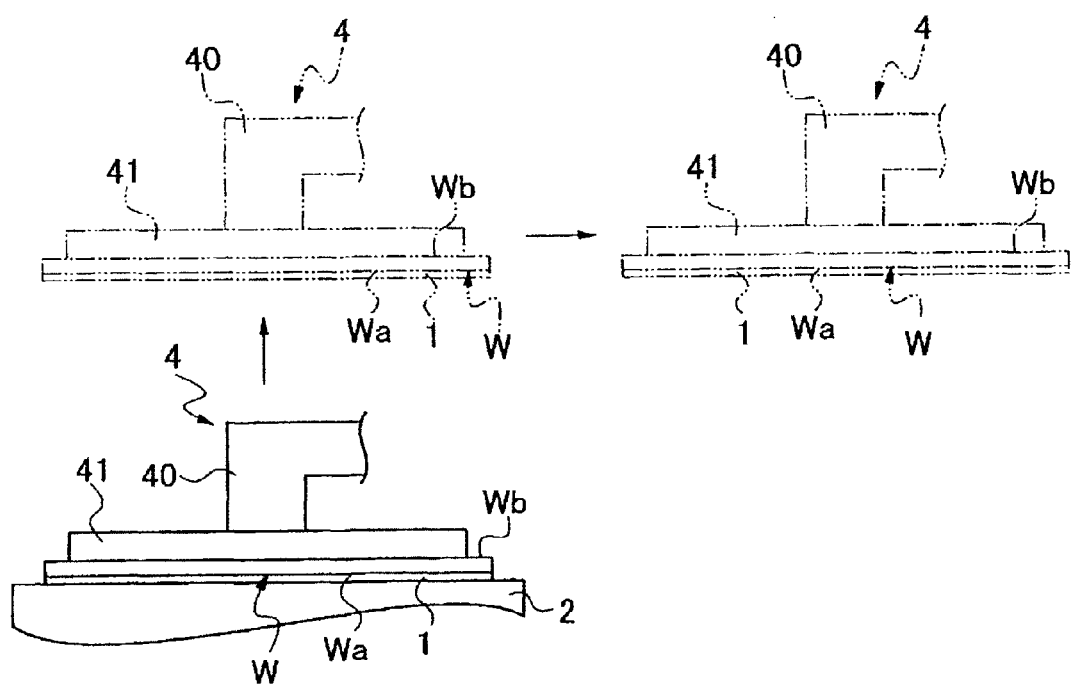
FIG. 7 is an elevational view showing a manner of transporting the wafer held on the chuck table.

As shown in FIG. 7, the wafer W having the modified layers 32 formed in the device area W1 is unloaded from the chuck table 2 and transported to a position where the next step is to be performed. For example, this transporting step is performed by using transporting means 4 having an arm portion 40 and a sucking portion 41 provided at the lower end of the arm portion 40. That is, the back side Wb of the wafer W is held under suction by the sucking portion 41 of the transporting means 4 and the arm portion 40 is moved to thereby transport the wafer W held by the sucking portion 41 to an apparatus for performing the next step. In the wafer W to be transported by the transporting step, the modified layers 32 are formed in only the device area W1 and the reinforcing portion W3 having no modified layers is formed around the device area W1. Accordingly, even when any external force is applied to the wafer W in the transporting step, there is no possibility that the wafer W may be broken along the modified layers 32.

(3) Back Processing Step

Figure 8:
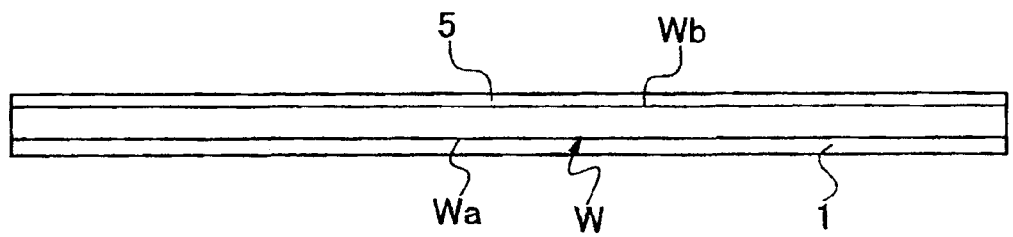
FIG. 8 is an elevational view of the wafer in the condition where a reflection film is formed on the back side of the wafer.
Figure 9:
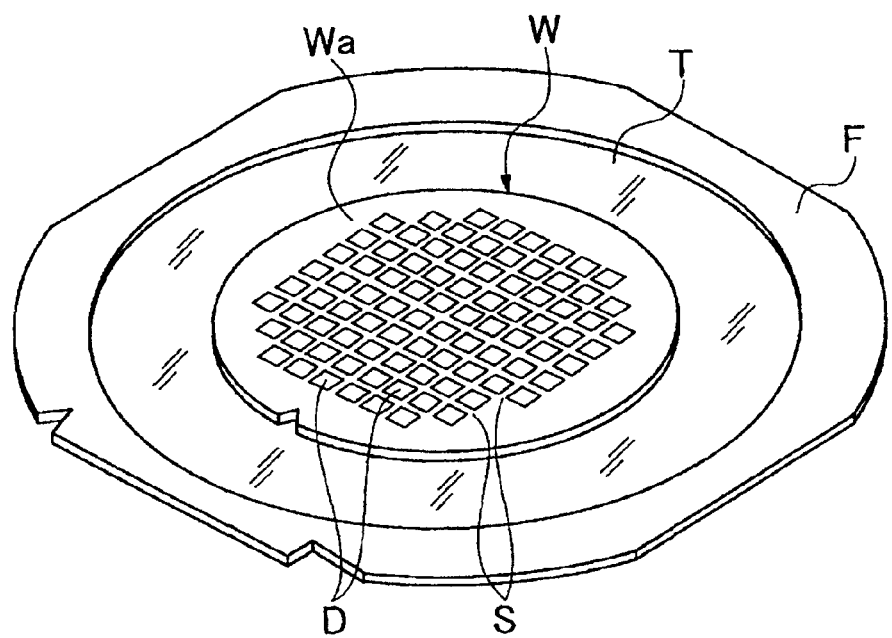
FIG. 9 is a perspective view of the wafer in the condition where the reflection film formed on the back side of the wafer is attached to a dicing tape supported to an annular frame and the protective tape attached to the front side of the wafer is removed.

The wafer W is transported by the transporting step to an apparatus for performing a back processing step of forming a reflection film on the back side Wb of the wafer W. As shown in FIG. 8, a reflection film 5 of gold, aluminum, etc. is formed on the back side Wb of the wafer W in the back processing step. This reflection film 5 is formed to improve the luminance of each optical device. For example, the reflection film 5 is formed by evaporation, sputtering, CVD, etc. Since the wafer W is not broken in the transporting step as described above, the reflection film 5 can be reliably formed on the back side Wb of the wafer W.

(4) Dividing Step

After performing the back processing step, the wafer W is attached to a dicing tape T in the condition where the reflection film 5 formed on the back side Wb comes into contact with the dicing tape T. An annular frame F is preliminarily attached to the peripheral portion of the dicing tape T, so that the wafer W is supported through the dicing tape T to the annular frame F. Further, the protective member 1 is peeled off from the front side Wa of the wafer W at this time.

Figure 10:
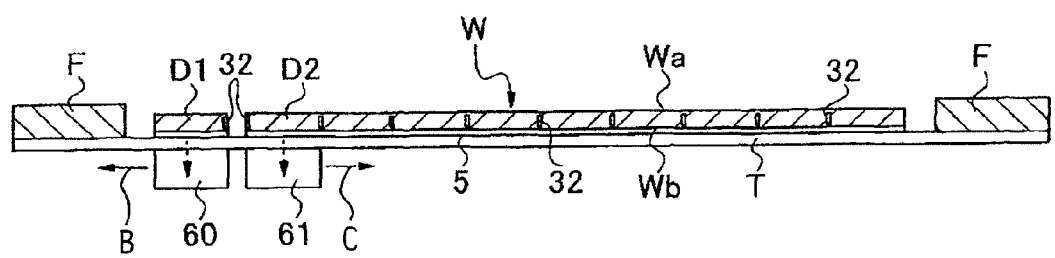
FIG. 10 is a sectional view showing a dividing step.

In the condition where the wafer W is supported through the dicing tape T to the annular frame F as described above, the reflection film 5 formed on the back side Wb of the wafer W is held under suction at any adjacent optical devices D1 and D2 by a pair of sucking portions 60 and 61 through the dicing tape T as shown in FIG. 10. In this suction holding condition, the sucking portions 60 and 61 are moved in opposite horizontal directions B and C as shown in FIG. 10, thereby applying a horizontal external force to the division line S between these adjacent optical devices D1 and D2. As a result, the modified layer 32 extending along the division line S between the adjacent optical devices D1 and D2 starts to be broken, thereby separating the optical devices D1 and D2 from each other. Similarly, all of the other optical devices are separated along the division lines S, thus dividing the wafer W into the individual optical devices D. The reflection film 5 remains on the back side of each optical device D.

Figure 11:
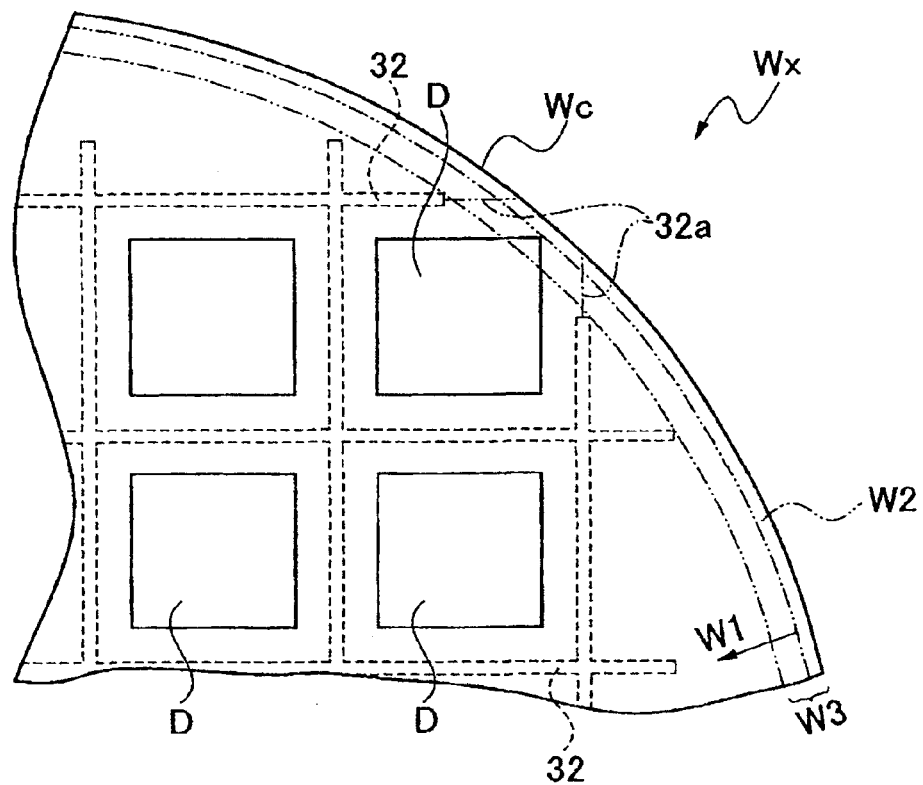
FIG. 11 is an enlarged plan view showing a modification of the wafer.

In the case of a wafer Wx shown in FIG. 11, a part of the optical devices D is formed close to the outer circumference We of the wafer Wx and the width of the peripheral marginal area W2 is accordingly very small. In this case, the modified layers 32 are formed in the modified layer forming step so that the opposite ends of each modified layer 32 do not reach the outer circumference of the device area W1. That is, the modified layers 32 are formed so that the optical devices D are not completely separated along the modified layers 32, thereby making the width of the reinforcing portion W3 larger than the width of the peripheral marginal area W2. In the next dividing step, the tensile force for separating the adjacent optical devices from each other along each modified layer 32 as a break start point is utilized to cut the reinforcing portion W3 along the extension lines 32a of the modified layers 32 as shown in FIG. 11. In such a case that a part of the optical devices D is formed close to the outer circumference We of the wafer Wx, the reinforcing portion W3 is formed so as to radially inwardly extend from the peripheral marginal area W2 into the device area W1.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for a wafer having a device area where a plurality of devices are formed and an annular peripheral marginal area surrounding said device area, said plurality of devices being respectively formed in a plurality of regions partitioned by a plurality of division lines formed on a front side of said wafer, said processing method comprising:

a modified layer forming step of holding said wafer on a chuck table in the condition where a back side of said wafer is exposed and applying a laser beam having a transmission wavelength to said wafer toward the back side of said wafer along said division lines in the condition where the focal point of said laser beam is set inside said wafer, thereby forming a modified layer as a division start point inside said wafer along each division line, wherein during said modified layer forming step, said laser beam is only applied to said wafer is said device area and is not applied to said wafer in said annular peripheral marginal area; and a transporting step of unloading said wafer from said chuck table and transporting said wafer to a position where a step to be next performed;

wherein said modified layer is not formed in said annular peripheral marginal area of said wafer in said modified layer forming step to thereby form an annular reinforcing portion in said annular peripheral marginal area.

2. The processing method for a wafer according to claim 1, further comprising a dividing step of applying an external force to said division lines of said wafer to thereby divide said wafer into said individual devices after performing said modified layer forming step.

3. A processing method for a wafer having a device area where a plurality of devices are formed and a peripheral marginal area surrounding said device area, said plurality of devices being respectively formed in a plurality of regions partitioned by a plurality of division lines formed on a front side of said wafer, said processing method comprising:

a modified layer forming step of holding said wafer on a chuck table in the condition where a back side of said wafer is exposed and applying a laser beam having a transmission wavelength to said wafer toward the back side of said wafer along said division lines in the condition where the focal point of said laser beam is set inside said wafer, thereby forming a modified layer as a division start point inside said wafer along each division line; and a transporting step of unloading said wafer from said chuck table and transporting said wafer to a position where a step to be next performed;

wherein said modified layer is not formed in said peripheral marginal area of said wafer in said modified layer forming step to thereby form a reinforcing portion in said peripheral marginal area;

wherein:

said wafer comprises an optical device wafer composed of a sapphire substrate and a plurality of optical devices formed on a front side of said sapphire substrate in a plurality of regions partitioned by a plurality of division lines; and said step to be next performed after performing said transporting step includes a back processing step of forming a reflection film on a back side of said optical device wafer.

4. The processing method for a wafer according to claim 3, further comprising a dividing step of applying an external force to said division lines of said wafer to thereby divide said wafer into said individual devices after performing said modified layer forming step.

* * * * *

UNITED STATES PATENT AND TRADEMARK OFFICE
CERTIFICATE OF CORRECTION

| | |
|---|---|
| PATENT NO. | : 8,541,287 B2 |
| APPLICATION NO. | : 13/534220 |
| DATED | : September 24, 2013 |
| INVENTOR(S) | : Kazuma Sekiya |

It is certified that error appears in the above-identified patent and that said Letters Patent is hereby corrected as shown below:

In the Claims:

Col. 6, line 10, delete "is said" and insert -- in said --.

Signed and Sealed this
Eighteenth Day of November, 2014

Michelle K. Lee
*Deputy Director of the United States Patent and Trademark Office*